United States Patent [19]

McClure

[11] Patent Number: 5,801,563
[45] Date of Patent: Sep. 1, 1998

[54] OUTPUT DRIVER CIRCUITRY HAVING A SINGLE SLEW RATE RESISTOR

[75] Inventor: David Charles McClure, Carrollton, Tex.

[73] Assignee: SGS-Thomson Microelectronics, Inc., Carrollton, Tex.

[21] Appl. No.: 588,988

[22] Filed: Jan. 19, 1996

[51] Int. Cl.$^6$ .................... H03K 5/12; H03K 17/687
[52] U.S. Cl. .................. 327/170; 327/112; 327/391; 326/83
[58] Field of Search ................. 327/108, 112, 327/185, 261, 309, 310, 327, 328, 333, 379; 326/56, 57, 58, 82, 83, 85, 86, 87, 102, 103

[56] References Cited

U.S. PATENT DOCUMENTS

| | | | |
|---|---|---|---|
| 5,013,940 | 5/1991 | Ansel | 326/83 |
| 5,099,148 | 3/1992 | McClure et al. | 326/86 |
| 5,107,465 | 4/1992 | Fung et al. | 365/230.08 |
| 5,111,075 | 5/1992 | Ferry et al. | 326/27 |
| 5,218,239 | 6/1993 | Boomer | 326/58 |
| 5,251,181 | 10/1993 | Toda | 365/230.08 |
| 5,258,952 | 11/1993 | Coker | 365/194 |
| 5,267,197 | 11/1993 | McClure | 365/189.01 |
| 5,267,210 | 11/1993 | McClure | 365/218 |
| 5,293,623 | 3/1994 | Froniewski et al. | 395/425 |
| 5,296,766 | 3/1994 | Masaki | 327/387 |
| 5,300,828 | 4/1994 | McClure | 307/443 |
| 5,305,268 | 4/1994 | McClure | 365/203 |
| 5,311,467 | 5/1994 | Lysinger et al. | 365/189.01 |
| 5,341,341 | 8/1994 | Fukuzo | 365/233 |
| 5,493,530 | 2/1996 | Lee et al. | 365/189.05 |
| 5,519,344 | 5/1996 | Proebsting | 327/108 |
| 5,521,878 | 5/1996 | Ohtani et al. | 365/233 |
| 5,537,060 | 7/1996 | Back | 326/58 |
| 5,539,696 | 7/1996 | Patel | 365/189 |
| 5,546,029 | 8/1996 | Koke | 327/112 |
| 5,568,081 | 10/1996 | Lui et al. | 327/380 |

*Primary Examiner*—Timothy P. Callahan
*Assistant Examiner*—My-Trang Nu Ton
*Attorney, Agent, or Firm*—Theodore E. Galanthay; Lisa K. Jorgenson; Renee M. Larson

[57] ABSTRACT

An output driver circuit an integrated circuit memory device prevents crowbar currents from occurring. The output driver uses just one resistive element having multiple taps so that the amount of silicon area used for slew rate control is minimized. The signals which control the output driver devices are carefully balanced for no skew and cross at a voltage level of Vcc/2 so that there is no crowbar current generated during tri-stating of the output driver output signal.

28 Claims, 2 Drawing Sheets

5,801,563

OUTPUT DRIVER CIRCUITRY HAVING A SINGLE SLEW RATE RESISTOR

IN THE CROSS REFERENCE TO RELATED APPLICATIONS

The subject matter of the present application is related to copending U.S. Application No. 08/173,197, filed Dec. 22, 1993, titled "Improved Static Memory Long Write Test", Docket No. 93-C-82, copending U.S. Application No. 08/172,854, filed Dec. 22, 1993, titled "Stress Test Mode", Attorney Docket No. 93-C-56, which are assigned to SGS-Thomson Microelectronics, Inc. and expressly incorporated herein by reference.

Additionally, the following pending U.S. Pat. Applications by David Charles McClure entitled:

"Architecture Redundancy", Ser. No. 08/582,424 (Attorney's Docket No. 95-C-136), and "Architecture Control", Ser. No. 08/580,827 (Attorney's Docket No. 95-C-143), which were both filed on Dec. 29, 1995, and have the same ownership as the present application, and to that extent are arguably related to the present application, which are herein incorporated by reference; and entitled:

"Test Mode Activation and Data Override", Ser. No. 08/587,709 (Attorney's Docket No. 95-C-1 37), "Pipelined Chip Enable Control Circuitry and Methodology", Ser. No. 08/588,730 (Attorney's Docket No. 95-C-138), "Output Driver Circuitry Having a Single Slew Rate Resistor", Ser. No. 08/588,988 (Attorney's Docket No. 95-C-1 39), "Synchronized Stress Test Control", Ser. No. 08/589,015 (Attorney's Docket No. 95-C-142), "Write Pass Through Circuit", Ser. No. 08/588,662 (Attorney's Docket No. 95-C-144), "Data-Input Device for Generating Test Signals on bit and Bit-Complement Lines", Ser. No. 08/588,762 (Attorney's Docket No. 95-C-145), "Synchronous Output Circuit", Ser. No. 08/588,901 (Attorney's Docket No. 95-C-146), "Write Driver Having a Test Function", Ser. No. 08/589,141 (Attorney's Docket No. 95-C-147), "Circuit and Method for Tracking the Start of a Write to a Memory Cell", Ser. No. 08/589,139 (Attorney's Docket No. 95-C-148), "Circuit and Method for Terminating a Write to a Memory Cell", Ser. No. 08/588,737 (Attorney's Docket No. 95-C-149), "Clocked Sense Amplifier with Wordline Tracking", Ser. No. 08/587,728 (Attorney's Docket No. 95-C-150), "Memory-Row Selector Having a Test Function", Ser. No. 08/589,140 (Attorney's Docket No. 95-C-151), "Synchronous Test Mode Initialization", Ser. No. 08/588,729 (Attorney's Docket No. 95-C-153), "Device and Method for Isolating Bit Lines from a Data Line", Ser. No. 08/588,740 (Attorney's Docket No. 95-C-154), "Circuit and Method for Setting the Time Duration of a Write to a Memory Cell", Ser. No. 08/587,711 (Attorney's Docket No. 95-C-156), "Low-Power Read Circuit and Method for Controlling a Sense Amplifier", Ser. No. 08/589,024 (Attorney's Docket No. 95-C-168), "Device and Method for Driving a Conductive Path with a Signal", Ser. No. 08/587,708 (Attorney's Docket No. 95-C-169), and the following pending U.S. Pat. Applications by Mark A. Lysinger entitled:

"Burst Counter Circuit and Method of Operation Thereof", Ser. No. 08/589,023 (Attorney's Docket No. 95-C-141), "Controller for Burst Counter Circuit", Ser. No. 08/588,648 (Attorney's Docket No. 96-C-03), which have the same effective filing data and ownership as the present application, and to that extent are arguably related to the present application, are incorporated herein by reference.

BACKGROUND OF THE INVENTION

The present invention relates generally to integrated circuit devices, and more specifically to integrated circuit memory devices having output driver circuitry.

In modern integrated circuit memory devices having a great number of input pins and output pins, it is common to encounter output driver crowbar current problems. Crowbar current is exacerbated for extremely large memory devices which may have thirty-two or more output pins simultaneously switching. Crowbar current occurs as an output pin of a memory device changes state and may be illustrated by reference to the traditional integrated circuit output driver circuitry 10 of FIG. 1. Output driver circuitry 10 of FIG. 1 has the following elements: p-channel MOS transistors 12, 14, 16, 22 and 24; n-channel MOS transistors 18, 20, 26, 28 and 30; slew rate resistors R1 and R2; and output pad 39. Data Out signal 32 is provided to the gates of transistors 12, 18, 24 and 26 as shown. Output Disable bar signal 34 drives the gates of transistors 20 and 14. Output Disable signal 36 drives the gates of transistors 22 and 28. Output driver circuitry 10 produces an output signal 38 present on output pad 39.

The electrical connections of output driver circuitry 10 will now be examined. A first source/drain of transistors 12, 14, 16 and a first terminal of resistor R2 are connected to power supply voltage Vcc. A second terminal of resistor R1 and a second source/drain of transistors 26, 28 and 30 are connected to power supply voltage Vss. A second source/drain of resistor 12 is connected to a first source/drain of transistor 18, a second source/drain of transistor 14, and the gate of transistor 16. The gate of transistor 14 is connected to the gate of transistor 20. A second source/drain of P Driver transistors 16 is connected to a first source/drain of N Driver transistor 30 to form output signal 38. A second source/drain of transistor 18 is connected to a first source/drain of transistor 20. A second source/drain of transistor 20 is connected to a first terminal of resistor R1. A second terminal of resistor R2 is connected to a first source/drain of transistor 22. A second source/drain of transistor 22 is connected to a first source/drain of transistor 24. A second source/drain of transistor 24 is connected to a first source/drain of transistor 26, a first source/drain of transistor 28 and a gate of transistor 30.

Resistors R1 and R2 are slew rate control resistors. When the output signal 38 changes state, P Driver transistor 16 turns off and N Driver transistor 30 turns on, or vice versa. It is difficult to maintain the P Driver transistor 16 in an off state as the N Driver transistor 30 turns on (or vice versa) during output switching since P Driver transistor 16 and N Driver transistor 30 are each controlled by their own separate gate. Also, slew rate control resistors R1 and R2 are each used by both P Driver transistor 16 and N Driver transistor 30.

In addition to the crowbar current problems encountered when switching the logic state of output signal 38, the output driver circuitry 10 of FIG. 1 requires two slew rate control resistors R1 and R2 each of which requires significant silicon area in the integrated circuit memory device. There is therefore an unmet need in the art to be able to address two prior art problems. First, there is a need to reduce as much as possible the occurrence of crowbar current upon simultaneous switching of a number of device output pins. Second, there is the need to reduce the amount of silicon area devoted to slew rate resistors such as resistors R1 and R2.

SUMMARY OF THE INVENTION

It is an object of the present invention to reduce the occurrence of crowbar currents of an integrated circuit memory device.

It is further an object of the present invention to reduce the amount of silicon area required for slew rate control resistance of an integrated circuit memory device.

Therefore, according to the present invention, an output driver circuit of an integrated circuit memory device prevents crowbar currents due to switching of output pins from occurring. The output driver uses just one resistive element that may have multiple taps so that the amount of silicon area used for slew rate control is minimized.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

The output driver circuitry of the present invention reduces the occurrence of crowbar currents of an integrated circuit memory device and further it reduces the amount of silicon area required for slew rate control resistance of an integrated circuit memory device.

Figure 1:
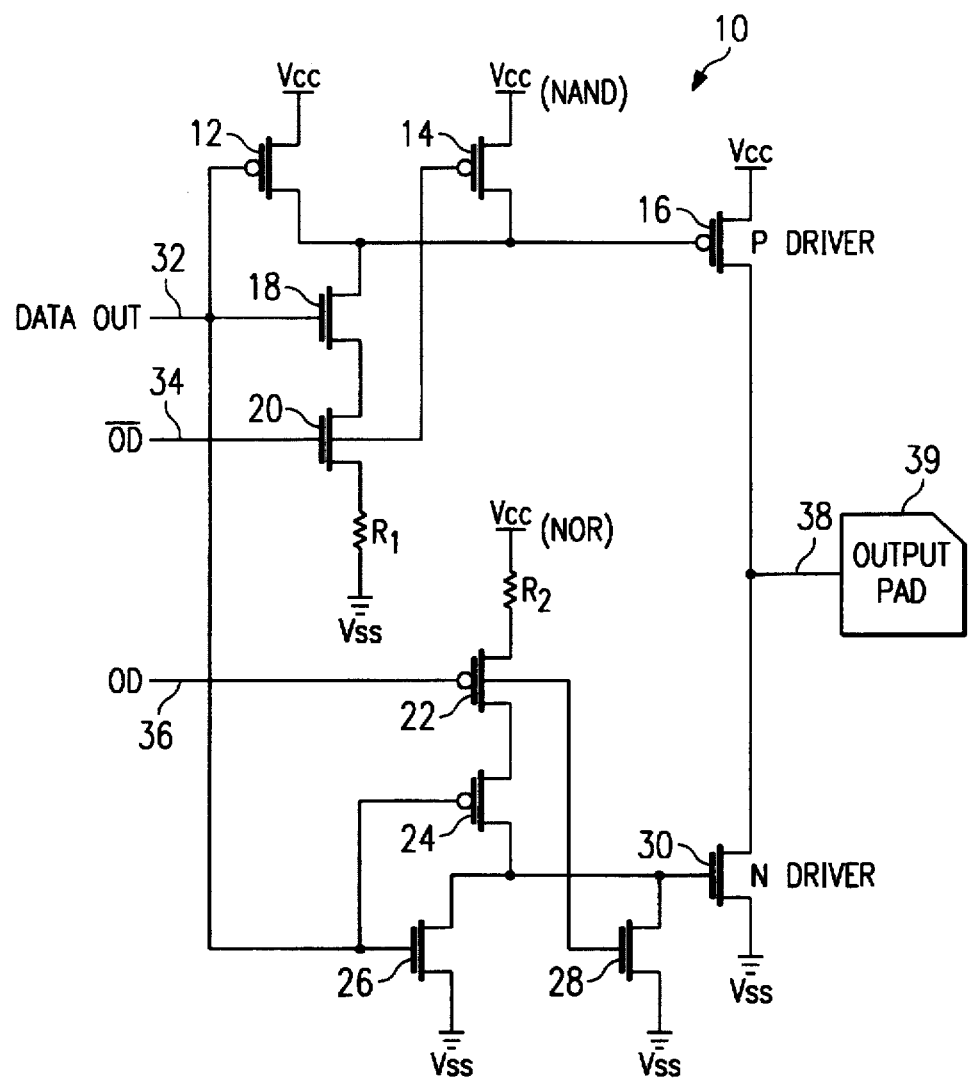
FIG. 1 is a schematic diagram of integrated circuit output driver circuitry, according to the prior art.
Figure 2:
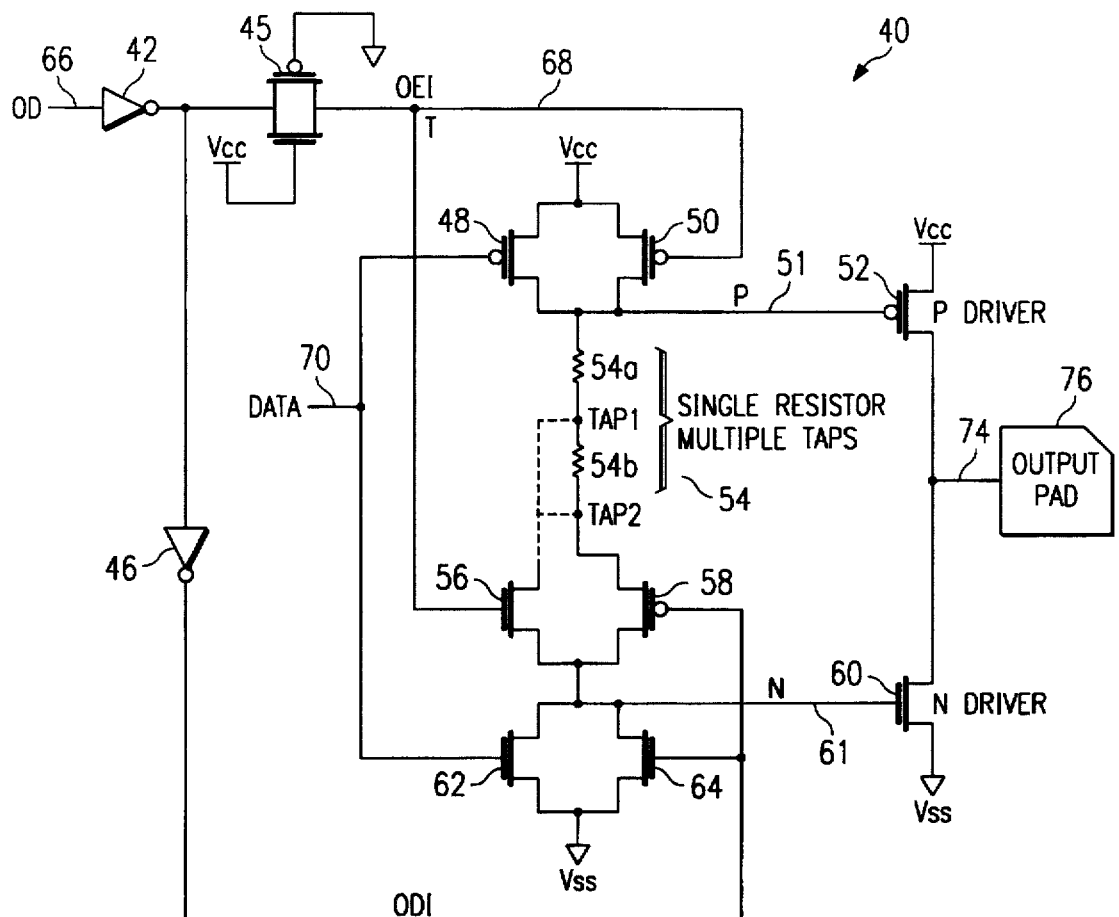
FIG. 2 is a schematic diagram of integrated circuit output driver circuitry, according to the present invention.

Referring to FIG. 2, a schematic diagram of integrated circuit output driver circuitry 40, according to the present invention, is shown. Output driver circuitry 40 has the following elements: inverters 42 and 46; p-channel MOS transistors 48, 50, 52 and 58; n-channel MOS transistors 56, 60, 62 and 64; passgate 45; and single resistive element 54. Output driver circuitry 40 is provided with Output Disable (OD) control signal 66 which is a function of the chip enable signal, write enable signal and output enable of the integrated circuit memory device (signals not shown here) and with Data signal 70; output driver circuitry 40 generates an output signal 74 on output pad 76.

The electrical connections of the elements of output driver circuitry 40 will now be examined. A first terminal of inverter 42 is provided Output Disable control signal 66; a second terminal of inverter 42 is connected to a first terminal of inverter 46 and the input terminal of passgate 45. Data signal 70 is provided to the gates of transistors 48 and 62. A first control signal of passgate 45, a second source/drain of transistor 62, a second source/drain of transistor 64 and a second source/drain of N driver transistor 60 are connected to power supply voltage Vss. A second control signal of passgate 45, a first source/drain of transistor 48, a first source/drain of transistor 50 and a first source/drain of P Driver transistor 52 are connected to power supply voltage Vcc. A second terminal of inverter 46 is connected to the gate of transistor 58 and the gate of transistor 64. A second source/drain of transistor 48 is connected to a second source/drain of transistor 50, a gate of P Driver transistor 52 and resistive element 54. A first source/drain of transistor 56 is connected to resistive element 54 between a first resistive tap 54a and a second resistive tap 54b. A second source/drain of transistor 56 is connected to a second source/drain of transistor 58, a first source/drain of transistor 62, a first source/drain of transistor 64 and a gate of N Driver transistor 60. A first source/drain of transistor 58 is connected to the second resistive tap 54b of resistive element 54.

Output Disable signal 66 goes to a high logic state to tri-state output signal 74. P signal 51 and N signal 61 which feed the gates of P Driver transistor 52 and N Driver transistor 60, respectively, are controlled by the same control signal Output Disable signal 66. Additionally, P signal 51 lags N signal 61 by the delay introduced by transistors 56 and 58 for a positive-going output signal 74 when the P signal 51 and N signal 61 are low-going, and N signal 61 lags P signal 51 by the same delay for a negative-going output signal 74 when the P signal 51 and N signal 61 are high-going.

A single resistive element 54 is used to control the slew rate of output signal 74. The resistance required to pull up N Driver transistor 60 through the p-channel transistor 58 is the total resistance of resistive element 54, while the resistance required to pull down P Driver transistor 52 to a low logic level is a smaller resistance, or a portion of the total resistance of resistive element 54. This smaller resistance is illustrated by the resistor tap 1 tied to the n-channel transistor 56. N-channel transistor 56 may also be tied to resistor tap 2 tied if desired.

A single resistive element having multiple taps requires that only one resistive element, rather than the prior art approach which required two resistors, be used. Different resistor tap points of a single resistive element may be used to adjust the amount of resistance and may be used to address the different noise levels involved when switching output signal 74 high or low. Different resistor tap points may be useful to compensate for the different capacitance located at P node 51 and N node 61 due to the differing amounts of capacitance associated with the gate of P Driver transistor 52 and N Driver transistor 60. Also, resistor 54 may have just one tap if so desired. The use of a single resistive element also means that only six transistors, and not eight transistors as in the prior art approach, are required to control P signal 51 and N signal 61. Additionally, the loading on Data signal 70 is two gates instead of four gates.

Output Enable Internal (OEI) signal 68 and Output Disable Internal (ODI) signal 72 are carefully balanced for no skew and these signals cross at voltage level Vcc/2. If it were not for passgate 45, the transistors of FIG. 2 could conduct from Vcc to Vss for the duration of the gate delay of inverter 46 because Output Disable Internal signal 72 would lag Output Enable Internal signal 68 if passgate 45 were not present. The delay of passgate 45 is chosen to match the delay of inverter 46 so that there is no lag between Output Disable Internal signal 72 and Output Enable Internal signal 68. As an example, passgate 45 ensures that transistor 58, controlled by Output Disable Internal signal 72, is turned off at the same time transistor 50, controlled by Output Enable Internal signal 68, is turned on.

Figure 3:
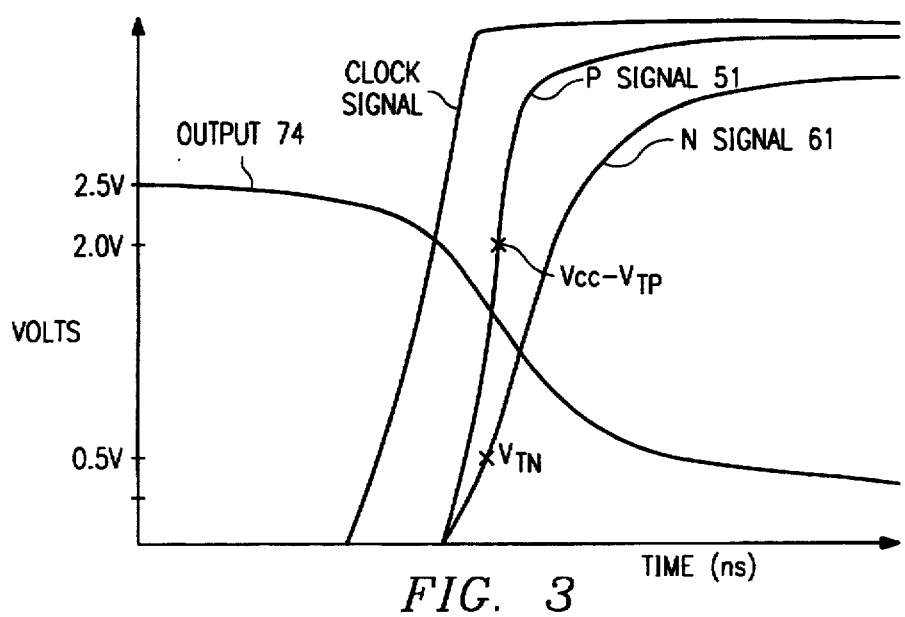
FIG. 3 is a waveform of the integrated circuit output driver circuitry of FIG. 2, according to the present invention.

Referring to FIG. 3, a waveform of the output driver of FIG. 2 illustrates that the present invention does not generate crowbar current. As the P signal 51 reaches a Vcc-Vtp voltage level (a voltage level of Vcc less the threshold voltage of P Driver transistor), the P Driver transistor 52 is turned off before N signal 61 reaches the Vtn voltage level (the threshold voltage of N Driver transistor 60). Conversely, if P signal 51 and N signal 61 are low-going signals then N signal 61 reaches the Vtn voltage level before P signal 51 reaches the Vcc-Vtp voltage level. As is clearly shown in FIG. 3, P Driver 52 and N Driver 60 never simultaneously conduct and thus no crowbar current is generated.

The present invention is desirable in any system or device employing multiple switching output drivers. Thus it is envisioned that the present invention is suitable for use in a number of device types, including: memory devices such as SRAM (static random access memory), DRAM (dynamic random access memory) and BRAM (burst RAM) devices; programmable devices such as PROM (programmable read only memory), EPROM (erasable programmable read only memory), Flash EPROM and EEPROM (electrically erasable programmable read only memory) devices; programmable devices, logic devices, gate arrays, ASICs (application specific integrated circuits); and microprocessors. The present invention is further suitable for use in any system or systems which employ such devices types.

While the invention has been particularly shown and described with reference to a preferred embodiment, it will be understood by those skilled in the art that various changes in form and detail may be made therein without departing from the spirit and scope of the invention.

What is claimed is:

1. An output driver circuit having a single slew rate resistive element, comprising:

a first power supply voltage;

a second power supply voltage;

a first driver element, having a control terminal, a first terminal coupled to the first power supply voltage and a second terminal;

a second driver element, having a control terminal, a first terminal coupled to the second terminal of the first driver element to define an output signal and a second terminal coupled to the second power supply voltage;

a resistive element having a first terminal, a second terminal and a tap;

a first transistor element having a first terminal connected to the first power supply, a second terminal connected to the first terminal of the resistive element, and a control terminal supplied with a data signal;

a second transistor element having a first terminal connected to the first power supply, a second terminal connected to the second terminal of the first transistor element, the first terminal of the resistive element and the control terminal of the first driver element, and a control terminal supplied with an output enable signal;

a third transistor element having a first terminal connected to the tap of the resistive element and a control terminal supplied with the output enable signal;

a fourth transistor element having a first terminal connected to the second terminal of the resistive element, a second terminal connected to a second terminal of the third transistor element, and a control terminal supplied with a control bar signal;

a fifth transistor element having a first terminal connected to the second terminal of the third transistor element, the second terminal of the fourth transistor element and the control terminal of the second driver element, a second terminal connected to the second power supply voltage, and a control terminal supplied with the data signal;

a sixth transistor element having a first terminal connected to the first terminal of the fifth transistor element, a second terminal of the third transistor element, a second terminal of the fourth transistor element and the control terminal of the second driver element, a second terminal connected to the second power supply voltage, and a control terminal supplied with control bar signal.

2. The circuit of claim 1, wherein the first power supply voltage is Vcc and the second power supply voltage is Vss.

3. The circuit of claim 1, wherein the first driver element and the second driver element are transistor elements.

4. The circuit of claim 3, wherein the first driver element is a p-channel MOS transistor and the second driver element is an n-channel MOS transistor.

5. The circuit of claim 1, wherein the resistive element is a single resistor having a plurality of multiple taps.

6. The circuit of claim 5, wherein the resistive element provides slew rate control of the output driver circuit.

7. The circuit of claim 1, wherein the first transistor element is a p-channel MOS transistor, the second transistor element is a p-channel MOS transistor, the third transistor element is an n-channel MOS transistor, the fourth transistor element is a p-channel MOS transistor, the fifth transistor element is an n-channel MOS transistor and the sixth transistor element is an n-channel MOS transistor.

8. The circuit of claim 1, further comprising:

an output pad coupled to a device package pin and connected to the output signal.

9. The circuit of claim 1, wherein the first terminal of the third transistor is connected to the second terminal of the resistive element rather than to the tap of the resistive element.

10. The circuit of claim 1, wherein the output driver circuit further comprises:

a passgate, having a first control terminal connected to the first power supply voltage and a second control terminal connected to the second power supply voltage so that the passgate conducts, and receiving a control signal on a first terminal of the passgate and an output enable signal on a second terminal of the passgate, wherein the passgate introduces a delay time to the output driver circuit; and an inverter element which introduces a delay time to the output driver circuit which is equal to the delay time of the passgate and which receives the control signal on an input terminal of the inverter element and which inverts the control signal to produce a control bar signal.

11. The circuit of claim 10, wherein because the delay time of the passgate is equal to the delay time of the inverter element there is no lag time between the output enable signal and the control bar signal.

12. The circuit of claim 11, wherein there is no skew between the output enable signal and the control bar signal.

13. The circuit of claim 1, wherein the output driver circuit is utilized in a system having a plurality of switching output drivers.

14. The circuit of claim 1, wherein the output driver circuit is utilized in an integrated circuit memory device having a plurality of switching output drivers.

15. The circuit of claim 14, wherein the integrated circuit memory device is a static random access memory (SRAM).

16. The circuit of claim 14, wherein the integrated circuit memory device is a programmable device.

17. The circuit of claim 14, wherein the integrated circuit memory device is a logic device.

18. The circuit of claim 14, wherein the integrated circuit memory device is an application specific integrated circuit (ASIC) device.

19. The circuit of claim 14, wherein the integrated circuit memory device is a dynamic random access memory (DRAM).

20. The circuit of claim 14, wherein the integrated circuit memory device is a microprocessor.

21. The circuit of claim 14, wherein the integrated circuit memory device is a gate array.

22. A method of eliminating crowbar current due to output switching of a plurality of output pins of an integrated circuit device, comprising the steps of:

causing a first control signal of a first driver element of the integrated circuit device to lag a second control signal of a second driver element of the integrated circuit device upon driving an output signal of the integrated circuit device to a first logic state; and causing the second control signal of the second driver element to lag the first control signal upon driving the output signal of the integrated circuit device to a second logic state, wherein the slew rate of the output signal is controlled by a resistive element and wherein the first control signal and the second control signal are coupled together by way of the resistive element.

23. The method of claim 22, wherein the first control signal lags the second control signal by a first delay time upon driving the output signal to the first logic state and the second control signal lags the first control signal by a second delay time upon driving the output signal to the second logic state.

24. The method of claim 23, wherein the first delay time is equal to the second delay time.

25. The method of claim 23, wherein the first delay time is equal to a delay defined by a first logic gate and a first resistive value of a resistive element, and the second delay time is equal to a delay defined by a second logic gate and a second resistive value of the resistive element.

26. The method of claim 25, wherein the resistive element controls the slew rate of the integrated circuit device.

27. The method of claim 26, wherein the resistive element has a plurality of resistance taps.

28. The method of claim 22, wherein the second driver element shuts off before the first driver element turns on when the first control signal lags the second control signal upon driving the output signal of the integrated circuit device to the first logic state; and wherein the first driver element shuts off before second driver element turns on when the second control signals lags the first control signal upon driving the output signal of the integrated circuit device to the second logic state.

* * * * *